United States Patent [19]
Joseph

[11] Patent Number: 5,289,129
[45] Date of Patent: Feb. 22, 1994

[54] MULTIPLE WINDING MRI GRADIENT COIL

[75] Inventor: Peter M. Joseph, Upper Darby, Pa.

[73] Assignee: The Trustees of the University of Pennsylvania, Philadelphia, Pa.

[21] Appl. No.: 959,961

[22] Filed: Oct. 13, 1992

[51] Int. Cl.[5] .......................................... G01R 33/20
[52] U.S. Cl. .................................... 324/318; 324/322
[58] Field of Search ............... 324/300, 307, 309, 318, 324/322; 128/653.5; 335/219

[56] References Cited

U.S. PATENT DOCUMENTS

| | | | |
|---|---|---|---|
| 4,617,516 | 10/1986 | Schenck | 324/318 |
| 4,728,895 | 3/1988 | Briguet et al. | 324/318 |
| 4,733,189 | 3/1988 | Punchard et al. | 324/318 |
| 4,737,716 | 3/1988 | Roemer et al. | 324/318 |
| 4,740,772 | 4/1988 | Prevot | 335/299 |
| 4,794,338 | 12/1988 | Roemer et al. | 324/39 |
| 4,926,125 | 5/1990 | Roemer | 324/318 |
| 4,950,994 | 8/1990 | Glover et al. | 324/320 |
| 5,185,576 | 2/1993 | Vavrek et al. | 324/318 |

OTHER PUBLICATIONS

Schenck et al., "Gradient Coil Designs Capable of Arbitrarily High Linearity", GE Corporate Research & Development Center., Schenectady, N.Y., p. 821.

Primary Examiner—Michael J. Tokar
Attorney, Agent, or Firm—Woodcock Washburn Kurtz Mackiewicz & Norris

[57] ABSTRACT

A cylindrical whole body MRI z gradient coil having multiple windings which are individually wound about a cylindrical support structure such that the windings are evenly distributed in azimuthal angle and interleaved with one another. The windings are preferably spaced in azimuthal angle by 360°/N, where N is the number of windings. In such a design, there is no net gradient along any transverse direction and the homogeneity of the gradient field in the transverse direction is thereby improved due to the resultant cancellation in terms proportional to the transverse field gradients. The multiple windings may be selectively connected in series or parallel in accordance with the output impedance and inductance of the current supply.

5 Claims, 3 Drawing Sheets

MULTIPLE WINDING MRI GRADIENT COIL

BACKGROUND OF THE INVENTION

1. Field of the Invention

The present invention relates to an improved cylindrical whole body magnetic resonance imaging (MRI) gradient coil for providing a magnetic field having a substantially linear gradient in an axial direction within the volume of the cylinder, and more particularly, to a cylindrical whole body MRI gradient coil having N windings interleavingly wound in the same direction about the surface of the coil support and separated from each other winding of the N windings by an azimuthal angle of approximately 360°/N. The resulting MRI gradient coil provides a magnetic field which is not only linear in the axial direction of the coil but also substantially linear in transverse directions of the coil.

2. Description of the Prior Art

An essential component of current magnetic resonance imaging systems is a winding of wire, called a "coil", whose purpose is to create a linear spatial gradient in the magnetic field within the coil. By convention, the coil is described using x, y and z coordinates, with the z axis normally parallel to the axis of the main magnet for systems in which the magnet has cylindrical geometry, such as for whole body imaging. As known to those skilled in the art, two kinds of coils are needed, namely, one which creates a gradient along the z (or longitudinal) axis of the coil, and two others which create gradients along either the x or y (transverse) axes. The present invention is primarily directed to an improved z gradient coil.

As known to those skilled in the art, the desired magnetic field gradients can in principle be created by a suitable pattern of current flowing on the surface of the cylinder of a cylindrical coil. However, if a small number of loops of wire are used to create the field, the resultant gradient suffers from inhomogeneity, meaning that the gradient is not optimally uniform over the desired region of space. Such principles are well known and have been addressed by Schenck in U.S. Pat. No. 4,617,516. In that patent, Schenck discloses a z gradient coil of the type illustrated in FIG. 1. As shown, Schenck's z gradient coil comprises a single wire 12 wrapped around a coil support structure 10 in a helical path such that the spacing between respective turns decreases in proportion to the distance from the center of the coil. In this single wire design, the center of the coil is anomalous because the winding changes its winding direction at center point 14.

As shown in FIG. 1, electrically conductive winding turns 12 are wound on the outer surface of cylindrical support structure 10 so that the axial density of the winding turns 12 is at a minimum at the center of the length of the coil support structure 10 and increases linearly from the center to each axial end of the coil. Winding turns 12 are wound so that they are symmetrically located about the center of coil support structure 10. At the center point 14, the direction of winding turns 12 is reversed so that the winding turns 12 are symmetrically located about the center point 14 of support structure 10. Winding turns 12 are also electrically insulated from each other in order to provide the desired current paths around the outer surface of cylindrical coil support structure 10. Terminal connections 16 are also used to connect the winding turns 12 with a power supply (not shown) which supplies a current to the winding turns 12. Generally, winding turns 12 are made from any electrically conductive material such as copper, while the coil support structure 10 is made from any non-magnetic electrically insulating material having sufficient strength and rigidity to be formed into a cylinder of the size required for a particular application. For example, coil support structure 10 may be comprised of glass fiber material. Further details regarding the single wire design of prior art FIG. 1 can be found in the aforementioned patent to Schenck.

While the single wire design of Schenck has been found to provide a substantially linear gradient in the axial direction within the volume of a cylindrical whole body z gradient coil, the single wire design is limited because of the tradeoffs implicit in choosing the density of the turns. For example, if the density is too low, then near the center of the coil there will be unwanted inhomogeneity of the gradient field. In particular, the field will exhibit an unwanted transverse dependence, becoming stronger as one approaches the side which contains the wire and weaker on the opposite side. This effect can be reduced, but not eliminated, by increasing the winding density so that there are more turns per inch at each point in the coil. However, this approach has the disadvantage that the increased turns increase the resistance and inductance of the coil, which is undesirable because the coil will then require a higher voltage driving circuit to achieve acceptably fast switching of the current pulses as needed for MRI imaging.

Accordingly, an improved z gradient coil is desired which eliminates the unwanted transverse dependence of the single wire z gradient coil without undesirably increasing the inductance and resistance of the coil. The present invention has been designed to meet these needs.

SUMMARY OF THE INVENTION

The present invention solves the aforementioned problems of the prior art by employing multiple windings in a cylindrical whole body z gradient coil of the type disclosed by Schenck. At a minimum, two windings are used which are individually wound about the coil support structure following the same equation relating azimuthal angle to z direction as used in the single coil design. However, in accordance with the invention, the respective windings are evenly distributed in azimuthal angle so that they interleave with one another. For example, if two windings were used, they are placed 180° apart on the cylindrical surface of the coil support. In such a design, there is no net gradient along any transverse direction, and the homogeneity of the gradient field is thereby improved. As will be apparent to those skilled in the art, any number of windings can be used and equally distributed in azimuthal angle by separating the respective windings in azimuthal angle by 360°/N, where N is the number of windings. By so distributing the windings by azimuthal angle, progressively improved homogeneity may be obtained.

In a preferred embodiment, the respective windings are selectively connected either in series or parallel to a power supply which supplies a current to the windings. Any circuit may be used to apply the currents to the multiple windings so long as the circuit allows equal currents to flow in each winding. Connecting the windings in parallel results in the lowest inductance, which is often desirable. However, the windings may also be connected in series, which has the effect of increasing both the inductance and the sensitivity. Accordingly, the coil of the invention is preferably switchable, i.e., easily adapted to either fast response (parallel) or to high resolution (series) implementations, depending on the needs of any particular user or experiment.

BRIEF DESCRIPTION OF THE DRAWINGS

The above and other objects and advantages of the invention will become more apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

Preferred embodiments of the invention will be described below with reference to FIGS. 2 and 3. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

Figure 1:
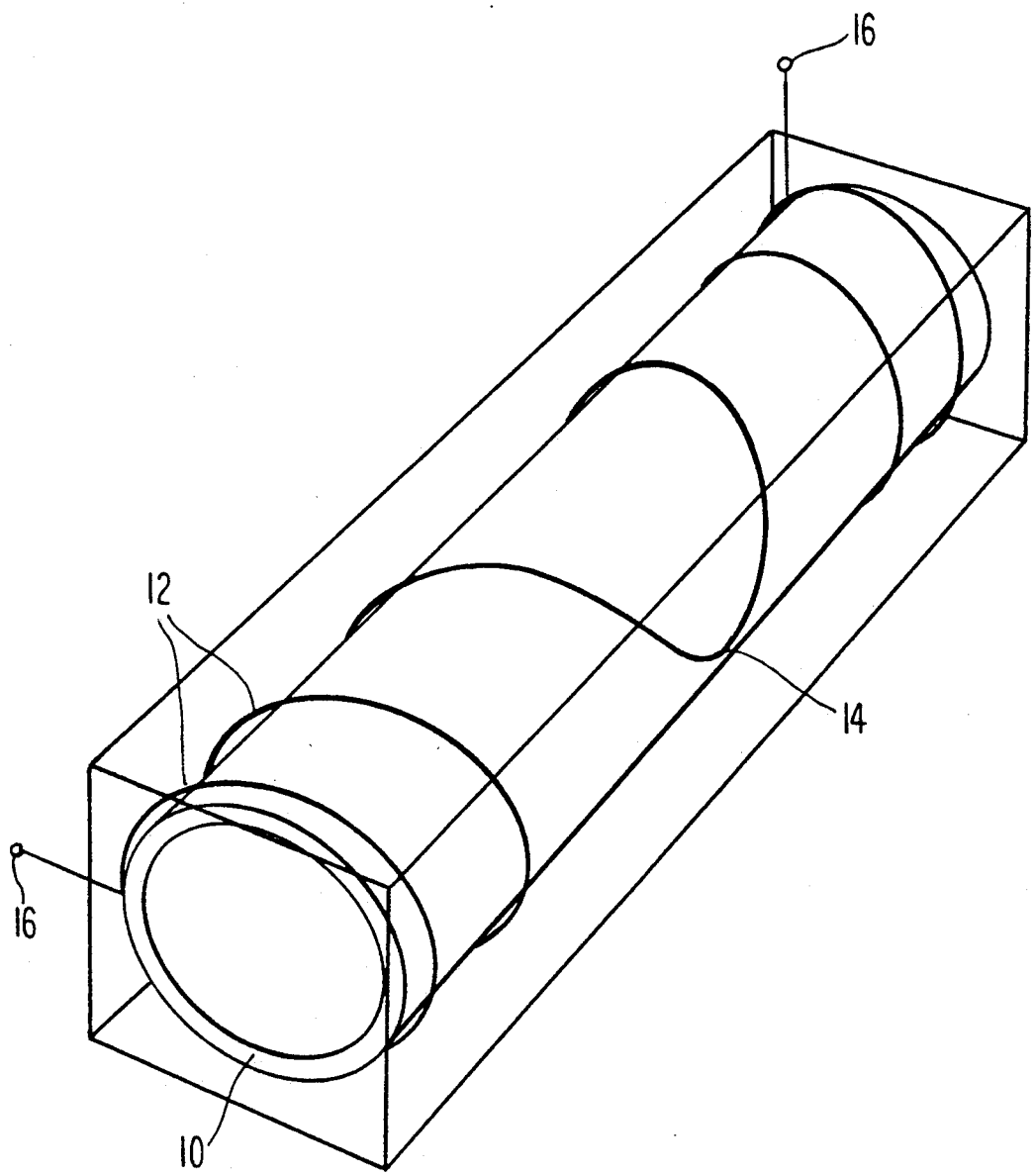
FIG. 1 illustrates a prior art single wire z gradient coil of the type disclosed by Schenck.
Figure 2:
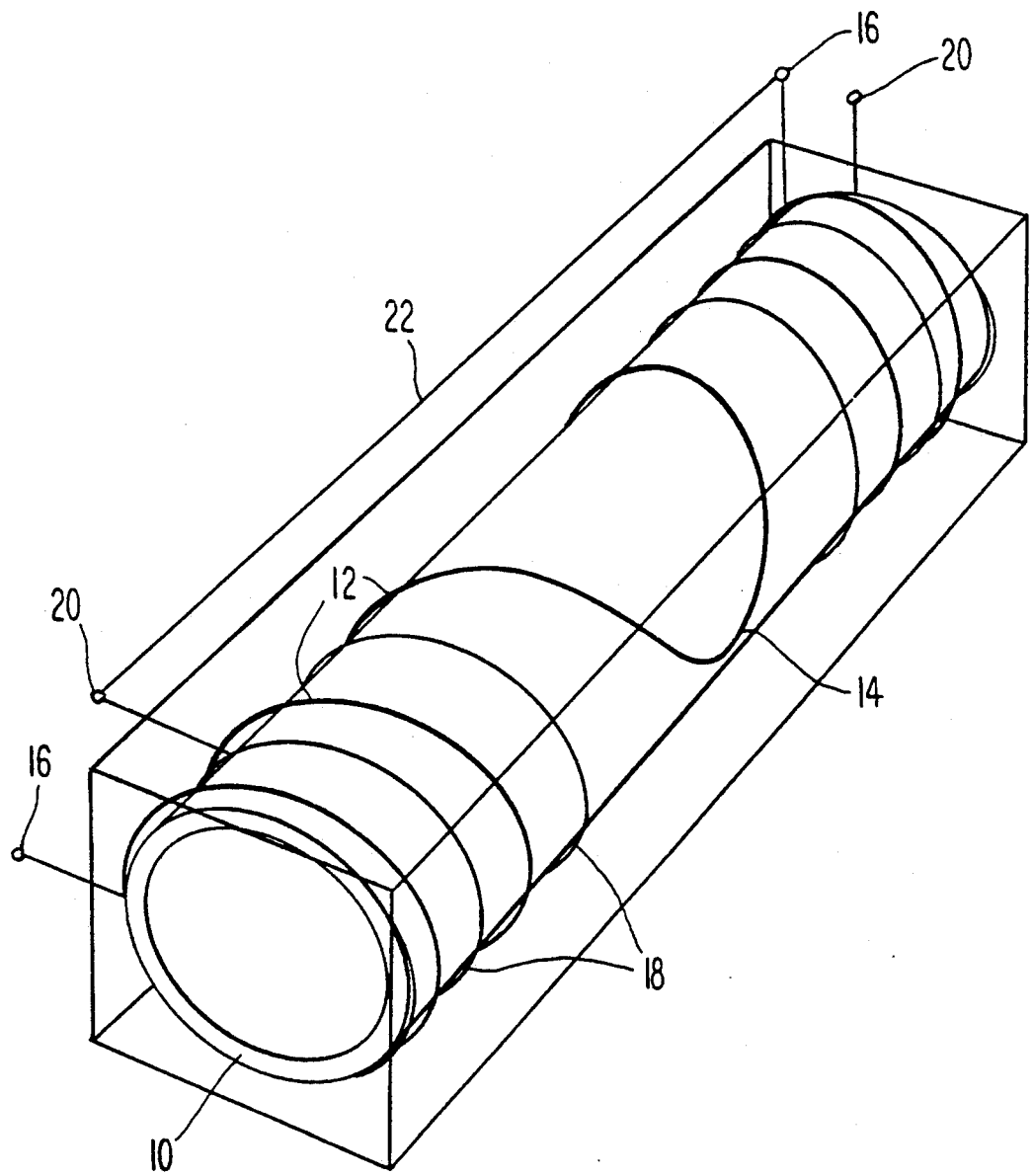
FIG. 2 illustrates a two wire z gradient coil in accordance with a preferred embodiment of the invention.

FIG. 2 illustrates a preferred embodiment of a two wire z gradient coil in accordance with the invention. As illustrated, a first electrically conductive winding 12 is wound about the surface of cylindrical coil support structure 10 in the same manner as illustrated above with respect to prior art FIG. 1. As in the embodiment of FIG. 1, the first electrically conductive winding 12 is wound helically in a symmetric manner about the center 14 of the coil support structure 10. Terminal connections 16 are also connected to the first winding 12 as in the case of the embodiment of prior art FIG. 1. However, in accordance with the invention, a second electrically conductive winding 18 is also wound in an interleaved manner with respect to the first winding 12. In accordance with the invention, the second winding 18 is offset in azimuthal angle by 180° (360°/2 windings) with respect to the first winding 12. For ease of illustration, the wire diameter of the second winding 18 has been illustrated to have a smaller diameter than the wire diameter of first winding 12. However, those skilled in the art will appreciate that the respective windings are preferably of the same cross-sectional diameter and formed of the same conductive material, which, in a preferred embodiment, is copper. As with the first winding 12, second winding 18 also has a terminal connection 20 to which current is applied from a power supply (not shown) for generating a magnetic field. A jumper wire 22 also may be used to selectively connect terminal connections 16 and 20 so that the first and second windings are selectively connected in series or in parallel as desired. Such a jumper wire 22 will be generally parallel to the z axis of the coil, but as will be appreciated by those skilled in the art, since the jumper wire 22 does not cause a magnetic field component in the z direction, it will not cause z gradients which adversely affect the MR imaging.

Figure 3:
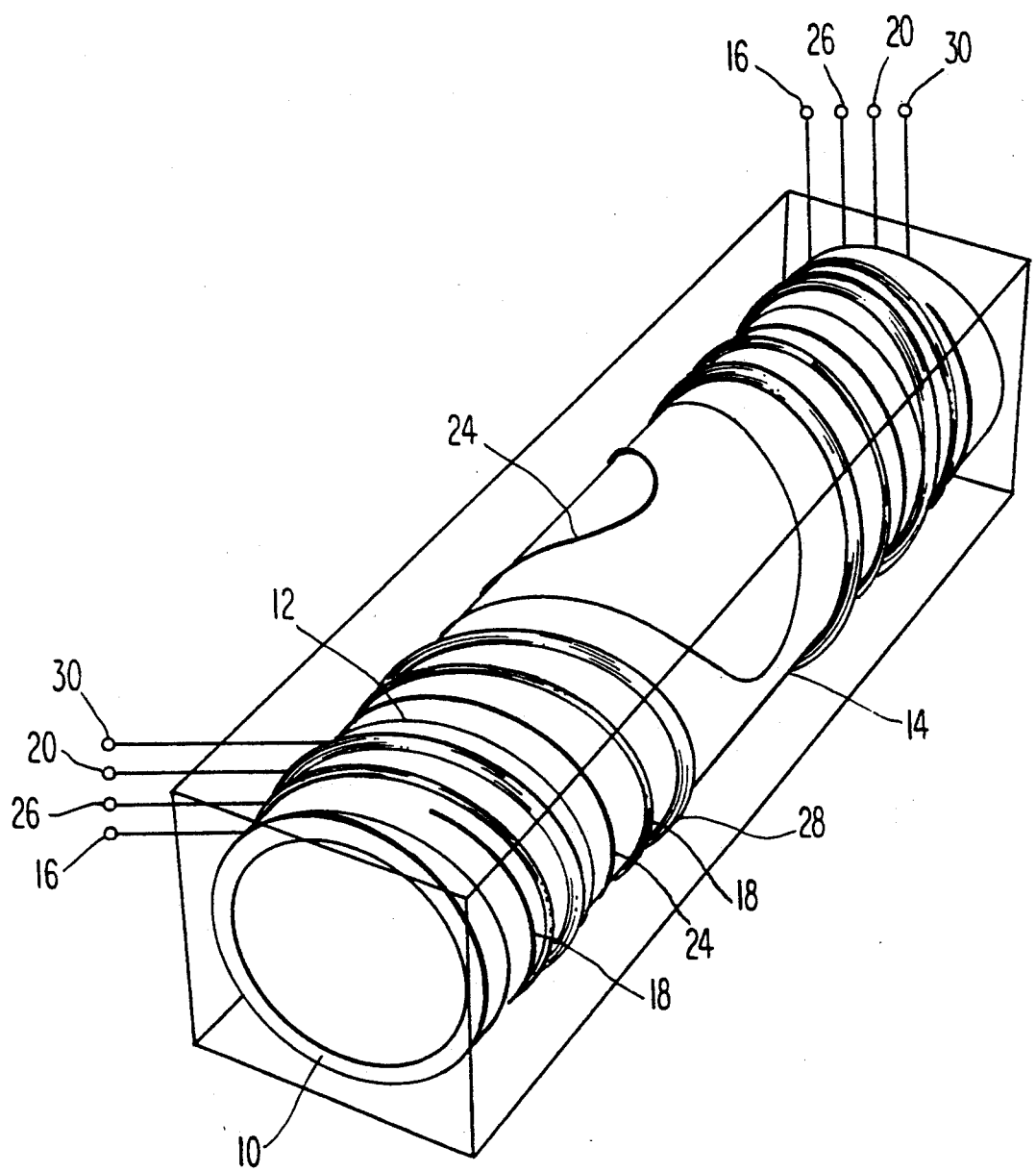
FIG. 3 illustrates a four wire z gradient coil in accordance with an alternative embodiment of the invention.

FIG. 3 illustrates an alternative embodiment of the invention in which four interleaved windings are offset in azimuthal angle by 90° (360°/4 windings) from each other. The coil of FIG. 3 thus corresponds to that of FIG. 2 except that a third winding 24 with respective terminal connections 26 and a fourth winding 28 with respective terminal connections 30 are also wound in an interleaved manner with the first and second windings such that the four windings 12, 18, 24 and 28 are offset by 90° with respect to each other. As in the embodiment of FIG. 2, one or more jumper wires 22 (not shown) also may be used for selectively connecting the respective windings in series or in parallel depending upon the output inductance of the power supply. In addition, as in the embodiment of FIG. 2, the windings in FIG. 3 are shown to have different diameters for ease of illustration. Those skilled in the art will appreciate that the respective windings preferably have the same cross-sectional diameter and are formed of the same conductive material, such as copper. Those skilled in the art will also appreciate that the embodiment of FIG. 3 is desirable to prevent quadrupoles which would otherwise cause aberrations in the transverse magnetic field.

The embodiments of FIGS. 2 and 3 greatly improve the homogeneity of the transverse gradients of a cylindrical whole body z gradient coil. A mathematical analysis of the magnetic field configuration for the single wire design can be found in the aforementioned patent to Schenck. As described therein, such a single wire design greatly improves the linearity of the magnetic field in the direction along the z axis. However, in order to better understand how the present invention further improves homogeneity in directions transverse to the axis of the z gradient coil, the analysis used in developing the cylindrical coils in accordance with the invention will be outlined below.

For an arbitrary coil, the field in the region within the coil can always be expressed as an infinite series of functions, each term of which is called a "spherical harmonic". This series has two indices: l, which goes from one to infinity, and m, which for a given l goes from −l to l. This is done using a spherical coordinate system with r=radius, $\theta$=polar angle, and $\phi$=azimuthal angle. Because of the symmetry of the geometry of a z gradient coil, it can always be assumed that the $\phi=0$ axis passes through the exact center of the coil, i.e., through the point 14 at which the wire reverses direction. In this case, the field, no matter how imperfect, will be a symmetric function of $\phi$, which means that one need only consider cosine functions of multiples of $\phi$ without any sine functions when evaluating the resulting magnetic field. That is, the most general expression for the field within a z gradient is:

$$B(r, \theta, \phi) = \sum_{l=1}^{\infty} \sum_{m=-1}^{l} a_{l,m} r^l P_{l,m}(\theta) \cos(m\phi), \quad \text{Equation 1}$$

where the P functions are the well known spherical harmonic functions.

The ideal z gradient coil would have only one term, namely, l=1 and m=0, which makes the magnetic field B proportional to r·cos($\theta$)=z. Any other terms in Equation 1 give imperfect or inhomogeneous gradients and are to be minimized. Accordingly, it will now be shown how the technique of the invention whereby additional coil windings are added can cancel large numbers of such undesired terms.

As shown in FIG. 2, the simplest embodiment of the invention consists of two windings which are spaced 180° apart about the cylindrical coil support 10. The second winding 18 creates a field identical to the first winding except that the pattern of inhomogeneity is rotated by 180°. This can be expressed as:

$$B_2(r, \theta, \phi) = B_1(r, \theta, \phi + \pi),\qquad \text{Equation 2}$$

where $B_1$ is the field from winding 12 and $B_2$ is the field from winding 18. Since the same current flows in each winding, the field of the modified coil is the sum of the $B_1$ and $B_2$ fields of the individual windings 12 and 18. However, for all terms which have an odd value for m, the corresponding cosine functions change sign since:

$$\cos(m(\phi + \pi)) = -\cos(m\phi).\qquad \text{Equation 3}$$

Since the corresponding factors $a_{,m} r P_m(\theta)$ of Equation 1 do not depend on $\phi$, they remain the same in the $B_1$ and $B_2$ fields. The result is that adding the extra winding causes an infinite number of undesired terms, namely, those with odd m, to cancel. This significantly improves the homogeneity of the desired gradient field. In particular, the lowest order term with m=1, which would ordinarily contribute a term proportional to x in the magnetic field, will cancel. This means that the new coil will have zero x gradient, which is a highly desirable property for a z gradient coil.

The above discussion can be generalized to any number of added windings. For example, by adding three additional windings (for a total of 4) distributed with an angular separation of 90° ($\phi$=90°) around the cylinder FIG. 3, the influence of all terms which are 2 times an odd number can be cancelled. This would include such terms with m=2, 6, 10, etc. In principle, the influence of any unwanted term in the series can be eliminated by an appropriate choice of the number of windings used. It is desirable to do this by successively doubling the number of windings so that the new windings will fall into the angular gaps between the previous windings so that the coil does not lose the benefit of the previously used windings. Further configurations with different numbers of windings will be apparent to those skilled in the art in accordance with the teachings of the invention.

As noted above, the coils in the embodiments of FIGS. 2 and 3 may be connected either in series or in parallel, depending on the best impedance match to the driving amplifier which supplies current to the terminal connections 16, 20, 26, 30 and the like. Series connection may be implemented by connecting jumper wire 22 between terminals 16 and 20 in the embodiment of FIG. 2 as illustrated. Series connection guarantees that the currents in the respective windings 12 and 18 are equal and gives the highest gradient for a given current at the expense of increased resistance and inductance. On the other hand, parallel connection provides lower impedance and may be implemented by applying the current to both terminal connections 16 and 20 in the embodiment of FIG. 2 without connecting jumper wire 22. Theoretically, there is a possibility that with parallel connection unequal currents would flow in the various coils. However, in practice, this is not a problem in accordance with the invention for several reasons. First, it is easy to obtain copper wire whose resistance is well controlled. Second, because of the tight inductive coupling between the wires, any differential in currents will experience a very low inductance and decay very rapidly. Third, even if some small imbalance should exist in the currents, the resulting inhomogeneity will obviously be much less than that which would occur with a single wire, which is equivalent to 100% imbalance. Other reasons will be apparent to those skilled in the art.

The present invention has been built and tested using interleaved double lead wires placed in grooves about a cylindrical support structure. Images were then taken by computer simulation by applying current to one wire and then alternately to two and four wires. It was found that improved homogeneity was obtained when the current was applied to two or more coils, as would be expected from the above mathematical derivation.

Those skilled in the art will appreciate that when series connection among the windings is desired, the coil could be wound with the various windings in different layers, one on top of another. In this case, the direction of circulation of the current would need to be the same in all coils, which would be achieved by running the current in alternate layers backwards and winding those coils in the opposite sense to those windings in adjacent layers. However, this design is not presently preferred since the different windings are not exactly rotational transformations of one another. In other words, while the gradient would be more homogeneous than that of a single coil, it may not be as homogeneous as that obtained in the preferred embodiment described above with respect to FIGS. 2 and 3. Accordingly, as described with respect to those figures, the preferred embodiment includes N windings wound about coil support structure 10 in the same direction so that the N windings are separated in azimuthal angle by 360/N°. Preferably, the coils of the preferred embodiment are also connected in parallel so as to reduce inductance and resistance.

Those skilled in the art will appreciate that by using wires of smaller diameter, greater gaps would be provided around the coil support structure 10 so that more wires could be accommodated. The current carrying capacity of the windings could also be improved by using multiple winding layers as just described. In this manner, the heat generated when current is applied to the wires can be better distributed in space in the multiple winding layers. Thus, besides improving the homogeneity of the magnetic field gradient in the x, y and z directions, the present invention also creates a more uniform distribution of heat. Depending on the type of material used to bond the coil of the invention to the coil support structure 10, this could be quite an engineering advantage.

Those skilled in the art will further appreciate that additional windings may be wound on top of windings in a lower layer in order to get composite windings with the same approximate cross-sectional size. For example, if a given turns density is required, at a particular value of z coordinate, to be 20 turns per inch for a single winding, the same gradient strength could be achieved by using two interleaved windings at 10 turns per inch or four interleaved windings of 5 turns per inch. Hence, for an N wire coil, each coil would have 1/N times the turns density of a single wire coil.

In an alternative embodiment of the invention, insulating layers may be provided in between respective windings so that one layer of windings may be wrapped around another layer of windings for improved homogeneity. The diameters of the wires and the like would then be selected to adjust the total resistance and inductance so that approximately the same amount of current flows through each of the windings.

The present invention thus provides linear z gradients as well as improved homogeneity in the x and y gradient directions. The technique of the invention is to be distinguished from the technique described by Schenck in the aforementioned patent whereby additional electrically conductive winding turns are used for compensating for variations in the linearity of the magnetic field gradient due to the finite length of the coil. Such z axis inhomogeneity is not the problem to which the present invention is directed. Rather, the present invention is directed to solving problems caused by unwanted transverse dependence which becomes stronger as one approaches the side of the winding which contains the wire and weaker on the opposite side in the single wire design. Schenck does not recognize this problem and certainly does not solve this problem by adding additional winding turns at the portions of the cylindrical support structure 10 near the ends. The present invention is thus believed to solve a previously unrecognized problem in the single wire design of Schenck.

Those skilled in the art will readily appreciate that many additional modifications to the invention are possible within the scope of the invention. For example, the technique of the invention may also be applied to the production of certain types of higher order inhomogeneous fields, for example, $z^2$ or $z^3$ fields. As known to those skilled in the art, the resulting coils are commonly called "shim coils" and are also used in clinical and experimental magnetic resonance applications involving spectroscopy. In addition, the technique of the invention may also be used in designing self-shielded gradient coils of the type described, for example, by Roemer et al. in U.S. Pat. No. 4,737,716. Accordingly, the scope of the invention is not intended to be limited by the preferred embodiments described above, but only by the appended claims.

I claim:

1. A cylindrical coil for providing a spatial magnetic field gradient which varies substantially linearly in an interior volume of said coil in a direction parallel to an axis of said coil and in directions transverse to said axis in response to a current applied to said coil by current applying means, said coil comprising:

a non-magnetic electrically insulating cylindrical coil support having an internal cavity which forms said interior volume; and N electrically conductive cylindrical windings wound in a plurality of turns in a substantially helical path about a surface of said coil support, each turn of each winding being electrically spaced from each other turn of each said winding such that spacing between respective turns of each said winding decreases in proportion to the distance of said respective turns from a center of each of said windings in a direction parallel to said axis of said coil, each of said N windings being interleavingly wound in the same direction about said surface of said coil support and separated from each other winding of said N windings in an angular orientation of approximately 360°/N about said coil support, whereby said current is applied to said N cylindrical windings.

2. A coil as in claim 1, further comprising means for selectively connecting said windings to said current applying means in series or parallel in accordance with an output impedance of said current applying means.

3. A coil as in claim 1, where N=2 and said windings are displaced 180° with respect to each other.

4. A coil as in claim 1, where N=4 and said windings are displaced 90° with respect to each other.

5. A cylindrical coil for providing a spatial magnetic field gradient which varies substantially linearly in an interior volume of said coil in a direction parallel to an axis of said coil and in directions transverse to said axis in response to a current applied to said coil by current applying means, said coil comprising:

a non-magnetic electrically insulating cylindrical coil support having an internal cavity which forms said interior volume; and N electrically conductive cylindrical windings wound in a plurality of turns in a substantially helical path about a surface of said coil support, each turn of each winding being electrically spaced from each other turn of each said winding such that spacing between respective turns of each said winding decreases in proportion to the distance of said respective turns from a center of each of said windings in a direction parallel to said axis of said coil, each of said N windings being wound in a different layer, one winding on top of another winding, in a direction about said surface of said coil support which is different from a winding direction of an adjacent winding, whereby said windings are connected in series and said current is applied to said windings so as to flow in opposite directions in adjacent windings.

* * * * *

UNITED STATES PATENT AND TRADEMARK OFFICE
CERTIFICATE OF CORRECTION

PATENT NO. : 5,289,129
DATED : February 22, 1994
INVENTOR(S) : Peter M. Joseph It is certified that error appears in the above-identified patent and that said Letters Patent is hereby corrected as shown below:

Column 4, line 54, in equation 1, change "$a_{,m} r \ P_m$" to --$a_{1,m} \ r^1 \ P^1_m$--.

Column 5, line 16, change "$a_{,mr} \ P_m$" to --$a_{1,m} \ r^1 \ P^1_m$--.

Column 5, line 30, after "cylinder" add --10 as shown in--.

Signed and Sealed this

Nineteenth Day of July, 1994

BRUCE LEHMAN

*Attest:*

*Attesting Officer*   *Commissioner of Patents and Trademarks*